United States Patent [19]

Komatsu et al.

[11] 4,298,883
[45] Nov. 3, 1981

[54] PLASTIC MATERIAL PACKAGE SEMICONDUCTOR DEVICE HAVING A MECHANICALLY STABLE MOUNTING UNIT FOR A SEMICONDUCTOR PELLET

[75] Inventors: Shigeru Komatsu, Yokohama; Satoshi Takahashi, Tokyo; Masao Wakatsuki, Yokohama, all of Japan

[73] Assignee: Tokyo Shibaura Electric Co., Ltd., Japan

[21] Appl. No.: 899,820

[22] Filed: Apr. 25, 1978

[30] Foreign Application Priority Data

Apr. 26, 1977 [JP] Japan ................................. 52-47387

[51] Int. Cl.³ .................... H01L 23/28; H01L 23/48; H01L 29/44
[52] U.S. Cl. ...................................... 357/72; 357/70; 357/80; 29/588
[58] Field of Search ................ 357/70, 72, 80; 29/588

[56] References Cited

U.S. PATENT DOCUMENTS

| | | | |
|---|---|---|---|
| 3,114,866 | 12/1963 | Iwata | 357/72 |
| 3,569,797 | 3/1971 | Simmons | 357/72 |
| 3,574,815 | 4/1971 | Segerson | 357/70 |
| 3,577,633 | 5/1971 | Homma | 357/70 |
| 3,629,668 | 12/1971 | Hingorany | 357/70 |
| 3,651,448 | 3/1972 | Pauza | 357/70 |
| 3,665,256 | 5/1972 | Goun et al. | 357/70 |
| 3,786,317 | 1/1974 | Thierfelder | 357/72 |
| 3,914,786 | 10/1975 | Grossi | 357/70 |
| 3,930,114 | 12/1975 | Hodge | 357/70 |
| 4,023,053 | 5/1977 | Shimizu et al. | 357/70 |
| 4,048,670 | 9/1977 | Eysermans | 357/72 |

Primary Examiner—Andrew J. James
Attorney, Agent, or Firm—Finnegan, Henderson, Farabow, Garrett & Dunner

[57] ABSTRACT

With a packaged semiconductor device of this invention, an IC pellet or chip supported on a mounting unit is encapsulated in plastics material, for example, epoxy resin or silicone resin. A plurality of lead strips are disposed at one end in the proximity of the mounting part of the mounting unit. The lead strips are electrically connected to the respective conductive pads of the IC pellet set on the mounting part of the mounting unit. The lead strips extend at the other end outside of an plastics material. Mounting unit-reinforcing side walls project substantially at right angles from the edges of the flat part of the mounting unit. The heat-radiating legs of the mounting unit extend substantially at right angles from the low edges of the side walls with the bottom surface of said legs exposed to the outside of the plastics material.

14 Claims, 12 Drawing Figures

4,298,883

PLASTIC MATERIAL PACKAGE SEMICONDUCTOR DEVICE HAVING A MECHANICALLY STABLE MOUNTING UNIT FOR A SEMICONDUCTOR PELLET

BACKGROUND OF THE INVENTION

This invention relates to a plastics material-packaged semiconductor device, and more particularly to improvements of a metal mounting unit on which an IC pellet is mounted.

A packaged semiconductor device 2 is already produced at present. This semiconductor device 2 as a whole has an outline shown, for example, in FIG. 1. The semiconductor device 2 is generally manufactured through the undermentioned steps. First, a flat metal plate is punched or etched to provide a metal frame assembly 4 indicated in FIG. 2. The metal frame assembly 4 comprises a large number of metal frame units 6 horizontally connected together by connecting bands 8, 10 to constitute a semiconductor device 2. For example, an IC pellet (not shown in FIG. 2) is mounted on the metal frame unit 6. This metal frame unit 6 further comprises an IC pellet-mounting part 12 which should be securely set in place and a plurality of lead strips 14 extending outward from the proximity of the periphery of the mounting part 12. One end of each lead strip 14 which lies near the mounting part 12 is left free. The lead strips 14 are all connected at the other end to a common connecting bar 10. The lead strips 14 are further connected together by a common connecting tie bar 16. A supporting bar 18 extends from the mounting part 12 to the connecting bands 8 and is connected to the connecting bands 8. Accordingly, the metal frame unit 6 is securely supported by the connecting bands 8, 10.

An IC pellet is mounted on the flat surface of the mounting part 12 of the metal frame unit 6. Numerous bonding pads on the IC pellet and lead strips 14 are electrically connected by bonding wires, respectively, using a bonding apparatus. In the molding steps, the IC pellet, mounting part 12 and the end portions of the lead strips 14 which lie close to the mounting part are encapsulated in plastics material. In the final step, the connecting band 10 and connecting tie bars 16 and supporting bars 18 are cut off to divide the metal frame assembly 4 into individual metal frame units 6. The lead strips 14 are bent as illustrated in FIG. 1, providing a semiconductor device 2 whose IC pellet is encapsulated in plastics material.

However, the semiconductor device manufactured by the above-mentioned process has been found to raise the undermentioned problem. Even where an IC pellet originally retained the property of a semiconductor element falling within the permissible range, a semiconductor device manufactured by setting the IC pellet on the mounting flat part 12 and encapsulating said IC pellet in plastics material somewhat lost its initial electric property, with the result that said property all fell outside of the prescribed range. This event appeared more noticeably particularly in an highly integrated circuit device than in a discrete semiconductor device.

The present inventors' study of the cause of the abovementioned drawback shows that contraction of molded plastics material directly imparts internal stress to the IC pellet; the mounting part 12 is distorted by said internal stress; and in consequence the IC pellet is subject to strains, giving rise to changes in its electric property.

Variation in the electric property of a semiconductor device whose IC pellet is encapsulated in plastic material admitting of mass production has posed a very serious problem. The reason is that the molding technique essentially adapted for quantity production of a semiconductor device actually indicates a prominent demerit due to a high percentage of manufactured semiconductor devices being disqualified.

SUMMARY OF THE INVENTION

It is accordingly an object of this invention to provide a semiconductor device so constructed as to be saved from a decline in the electric property, when its IC pellet is encapsulated in plastics material.

Another object of the invention is to provide a semiconductor device comprising a mechanically stable mounting unit on which an IC pellet is to be set.

Still another object of the invention is to provide a semiconductor device so constructed as to ensure effective radiation of high heat.

According to this invention, there is provided a semiconductor device which comprises a semiconductor pellet; a mounting unit including a plate-like mounting part for carrying a semiconductor pellet and a side plate section extending substantially at right angles from the edge of the flat part; a package member made of electrically insulating resin to encapsulate the semiconductor pellet and mounting unit; and a large number of individually separate lead members fixed to the package member which are disposed at one end close to the mounting part and electrically connected to the semiconductor pellet; and extend outside of the package member at the other end.

DETAILED DESCRIPTION OF THE PREFERRED EMBODIMENTS

There will now be described by reference to the accompanying drawings a semiconductor device according to the preferred embodiments of this invention.

Figure 1:
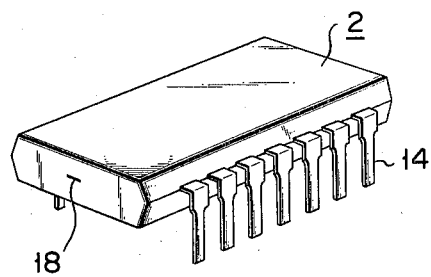
FIG. 1 is an oblique view of a general semiconductor device, showing its outline.
Figure 3:
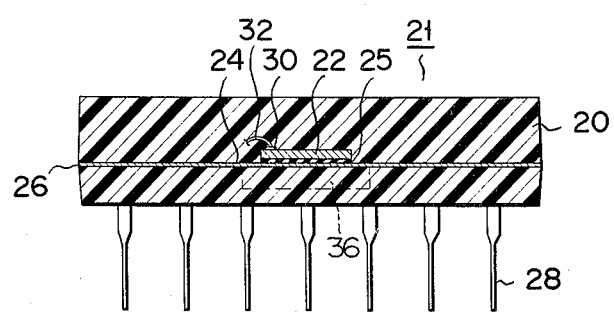
FIG. 3 is a schematic sectional view of a semiconductor device according to one embodiment of this invention.

FIG. 3 is a longitudinal sectional view of a semiconductor device 21 embodying this invention which has substantially the same outline as that of FIG. 1. A package 20 is made of plastics material, for example, epoxy resin or silicone resin. A pellet or chip, for example, IC pellet 22 in which circuit elements are formed is embedded substantially at the center of the package 20. The IC pellet 22 is mounted on the flat surface of the mounting part 34 of the mounting unit 24 by an adhesive agent, for example, epoxide resin or Au-Si eutectic material and encapsulated by the transfer mode. As seen from FIG. 3, the IC pellet 22 is positioned substantially at the center of the package 20.

In other words, the IC pellet 22 is received in the package such that a distance between the surface of said pellet 22 and the upper surface of the package 20 is equal to a distance between the surface of the pellet 22 and the lower surface of the package 20; both lateral edges of the package 20 are spaced from the center of the pellet 20 at the same distance; and both crosswise edges of the package 20 are set apart from said center at the same distance. Embedded in the package 20 are supporting bars 26 extending from the flat part 34 of the mounting unit 24 and part of lead strips 28 which lie at one end close to the mounting part of the mounting unit 24 and on the same plane as said mounting part. The lead strips extend outside of the package 20 at the other end. Connecting pads 30 provided on the surface of the IC pellet 22 and lead strips 28 are electrically connected together by bonding wires 32 respectively (though only one bonding wire is indicated to simplify the representation).

Figure 2:
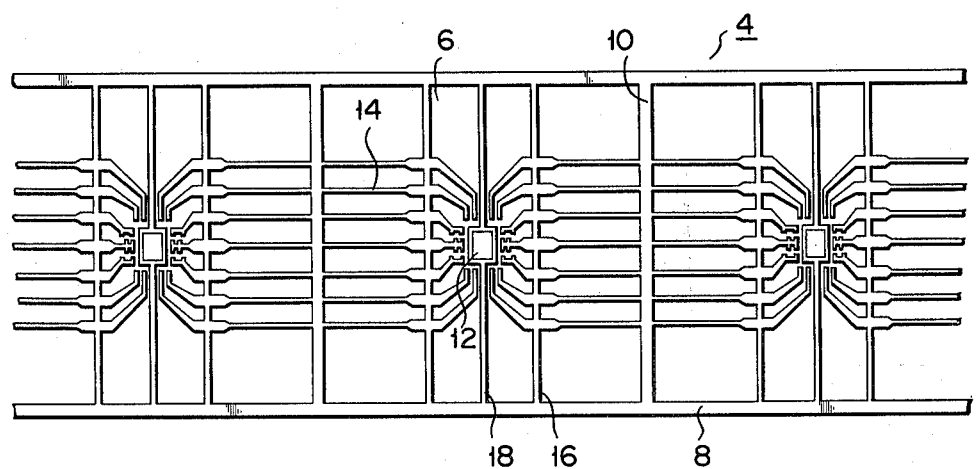
FIG. 2 is a plan view of a metal frame assembly constituting the prior art semiconductor device.
Figure 4:
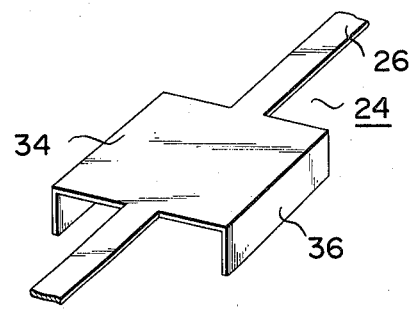
FIG. 4 is an oblique view of an IC pellet-mounting unit encapsulated in the package of the semiconductor device of FIG. 3.
Figure 5:
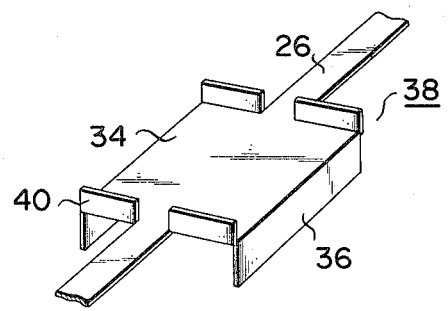
FIG. 5 is an oblique view of an IC pellet-mounting unit modified from that of FIG. 4.
Figure 6:
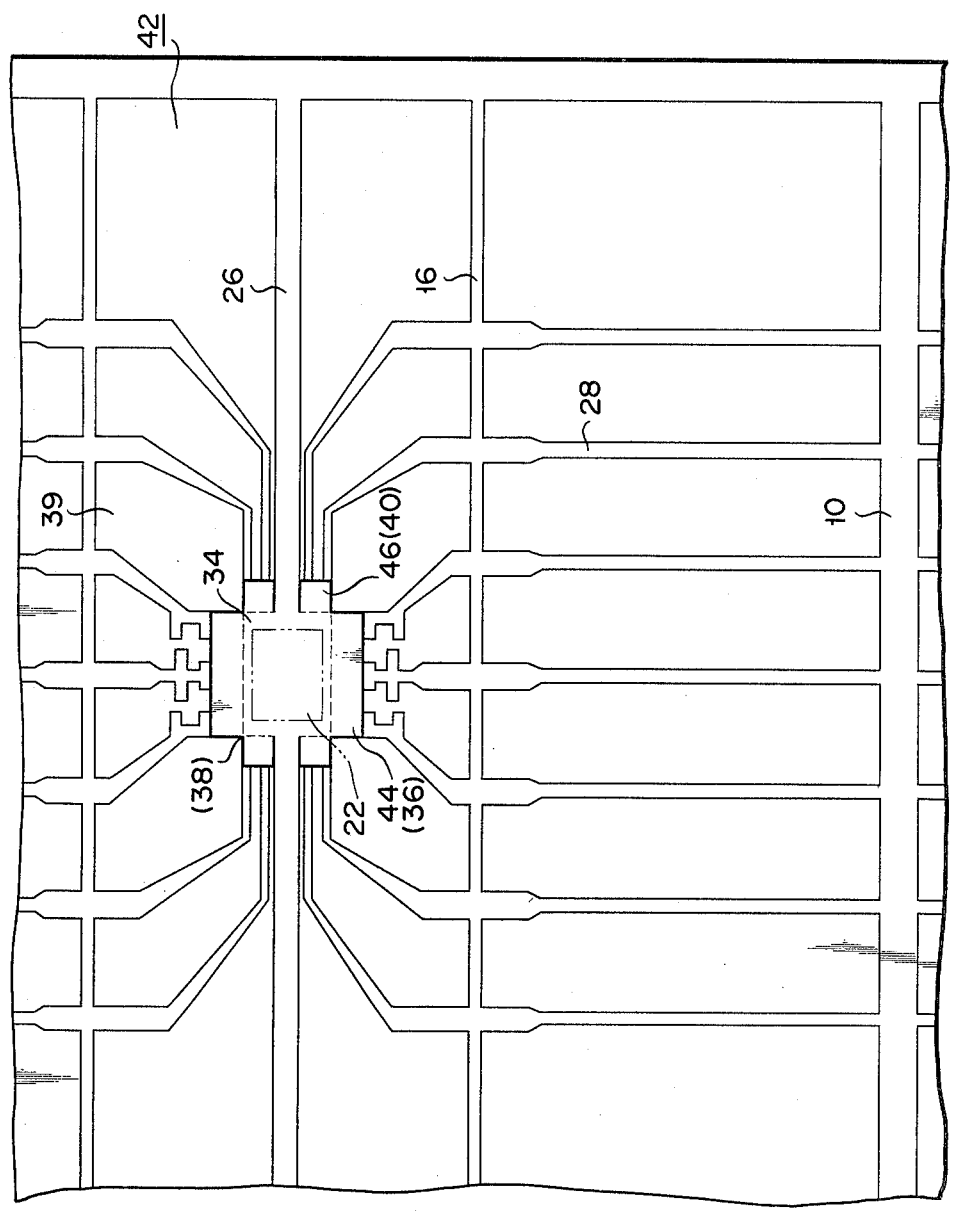
FIG. 6 is a fractional plan view of a metal plate for fabricating a mounting frame assembly comprising the IC pellet-mounting units of FIG. 5.

When encapsulated in the package 20, the mounting unit 24 and lead strips 28 are securely set in place due to the contraction of plastics material when the package 20 is molded therefrom. The prior art mounting part 12 of FIG. 2 was simply formed into a flat plate. In contrast, the mounting unit 24 of this invention comprises, as shown in FIG. 4, not only a flat mounting part 34 for mounting the IC pellet 22, but also a pair of reinforcing walls 36 bent preferably substantially at right angles to the flat part 34. The mounting unit 24 of FIG. 4 only comprises lateral side reinforcing walls 36 of the same height, while the mounting unit 38 of FIG. 5 comprises not only the similar lateral side reinforcing walls 36, but also other crosswise side reinforcing walls 40. The mounting unit 39 of FIG. 6 shaped like that of FIG. 5 is fabricated by punching or etching a metal plate 42, for example, a plate of Kovar and bending the edge portions by press. Referring to FIG. 6, thick solid lines show the outline of the cutoff sections of the mounting unit 39 and broken lines indicate the outline of the bent portions thereof. As seen from FIG. 6, when the plate 42 is punched to provide the mounting unit 39, plate segments 44, 46 for forming the reinforcement walls 36, 40 are retained around the mounting part 34 enclosed in broken lines. A mounting unit fabricated from the mounting frame assembly 4 of FIG. 2 is not provided with such reinforcement walls 36, 40. In FIG. 6, numerals (enclosed in parenthesis) denoting the parts which are later fabricated from the metal plate 42 are cited from the other drawings. The connecting tie bars 16 by which the lead strips 28 (FIG. 6) are connected together are removed after the lead strips 28 are packaged at one end. The lead strips 28 are severed at the other end from the connecting bands 10, similarly after packaged. In FIG. 6, the IC pellet 22 is indicated in imaginary lines.

Figure 7:
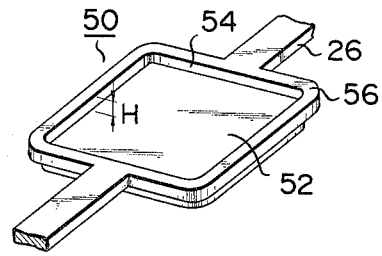
FIG. 7 is an oblique view of another IC pellet-mounting unit modified from that of FIG. 4.
Figure 8:
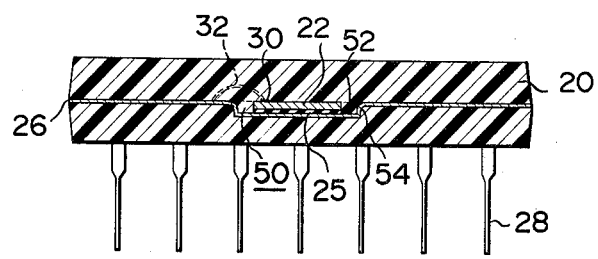
FIG. 8 is a schematic sectional view of a modified semiconductor device of this invention whose IC pellet-mounting unit (shown in FIG. 7) is encapsulated in a package made of electrically insulating plastics material.

The mounting unit 50 of FIG. 7 is a saucer type as a modification of the mounting units 24, 38 of FIGS. 4 and 5. Like the mounting units 24, 38, the mounting unit 50 of FIG. 7 comprises a mounting part 52 and a reinforcing wall 54 projecting upward from the entire periphery of said mounting part 52. While the flat part of the mounting units 24, 38 is made flush with the lead strips 28 and supporting bar 26, the mounting part 52 of the mounting unit 50 lies on a different plane from the lead strips 28 and the supporting bars 26, as illustrated in FIG. 8. A distance between the plane on which the lead strips and supporting bars 26 are formed and the flat part 52 of the mounting unit 50, namely, the height H of the reinforcing wall 54 is so defined as to render the surface of the IC pellet 22 set on the flat mounting part 52 of the mounting unit 50 flush with the plane on which the lead strips 28 are provided. Alignment of the lead strips 28 and IC pellet 22 on the same plane has the advantage of reliably bonding connecting pads 30 mounted on the IC pellet 22 to the lead strips 28 at one end by bonding wires 32 for electrical connection.

As in the mounting unit 34 of FIG. 6, lead strips connecting tie bars, mounting part and connecting bands constituting the mounting unit 50 of FIG. 7 are etched or punched out of a metal plate forming the mounting frame assembly. Later, the mounting part alone is depressed by means of, for example, contraction. The inner bottom plane of a cavity formed by said depressed flat part corresponds to the mounting part 52 of the mounting unit 50 of FIG. 7 on which the IC pellet 22 is mounted. Since the cavity is provided by contraction, a flange 56 is formed on the top of the wall 54 of the mounting unit 50 constitutes.

The mounting units 24, 38, 50 of this invention constructed as described above are mechanically stable and little distorted by stresses transmitted from the interior of plastics material when a package is molded therefrom. Since the mounting unit, when packaged, does not impart stresses to the IC pellet, the finished semiconductor device of the invention retains the original electric property.

Figure 9:
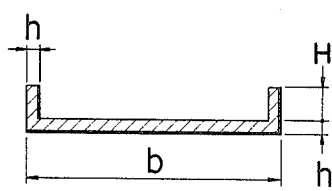
FIG. 9 shows the cross section of the simplified form of the IC pellet-mounting units of FIGS. 4, 5 and 7.

There will now be explained by reference to FIG. 9 showing the simplified form of the mounting unit, the reason why the mounting units 24, 38, 50 of the invention are mechanically stable.

Now let it be assumed that a bending moment M is applied to a mounting unit having a cross sectional shape shown in FIG. 9, and an arcuate distortion having a curvature radius $\rho$ arises. Then there results the following equation.

$$\rho M = \frac{Ebh^2}{12}\left\{ 4 + \frac{8H^3}{bh^2} - \frac{12\left(H^2 - \frac{bh}{2}\right)^2}{bh^2(b + 2H)} \right\} \quad (1)$$

where:
E = Young's modulus of a metal plate used to fabricated a mounting unit

H = height of the reinforcing wall
h = thickness of the reinforcing wall and flat part of the mounting unit
b = width of the mounting unit The right side term of the equation (1) above denotes resistance to distortion, namely, distortion rigidity. The larger the value expressed by the right side term, the higher the mechanical stability of the mounting unit. With the prior art mounting plate having no reinforcing walls, H is taken to be zero. With the prior art mounting unit, therefore, the following equation results.

$$\rho M = \frac{Ebh^2}{12} \qquad (2)$$

$$(H = 0)$$

Changes in the distortion rigidity varying with the value of H were measured as shown in Table 1 below with the distortion rigidity in case of H=O taken to be 1, b to be 2.5 mm and h to be 0.25 mm.

TABLE 1

| H (mm) | Ratio to rigidity in case of H = O |
|---|---|
| 0.00 | 1.00 |
| 0.20 | 2.44 |
| 0.25 | 3.20 |
| 0.30 | 4.16 |
| 0.40 | 6.74 |

Table 1 above shows that any slight increase in the height H of the reinforcing wall elevates the distortion rigidity of the mounting unit.

Figure 10:
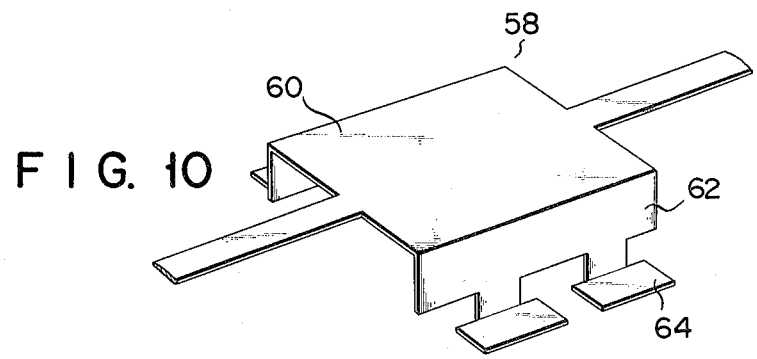
FIG. 10 is an oblique view of a highly heat-radiating IC pellet-mounting unit.
Figure 11:
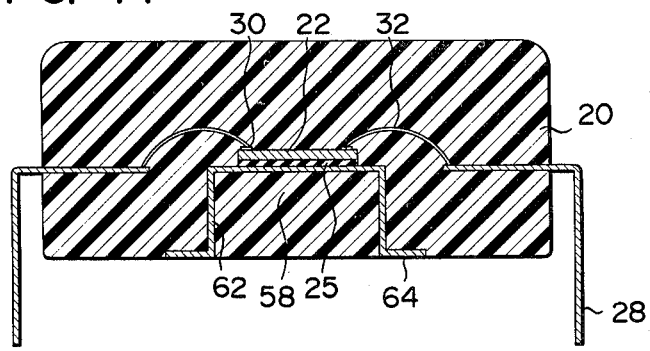
FIG. 11 is a sectional view of a semiconductor device according to still another embodiment whose IC pellet-mounting unit (FIG. 10) is encapsulated by a package made of electrically insulating plastics material.
Figure 12:
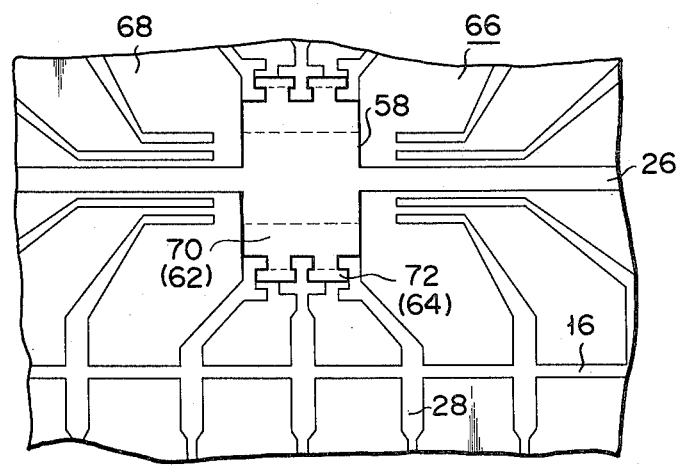
FIG. 12 is a fractional plan view of a metal plate for producing a mounting frame assembly comprising the IC pellet mounting units of FIG. 10.

The mounting unit 58 of FIG. 10 is not only mechanically stable, but also effectively radiates heat generated in an IC pellet. The mounting unit 58 comprises a flat mounting part 60, reinforcing walls 62, and heat-radiating legs 64 bent preferably substantially parallel to the mounting part 60. When the mounting unit 58 is encapulated in the package 20 as shown in FIG. 11, the bottom surface of the heat-radiating legs 64 is exposed out of the package 20. However, said bottom surface need not be made flush with the outer surface of the package 20. Said bottom surface may be positioned very close to the inner wall of the package 20. Namely, the heat-radiating legs 64 may be embedded in the package 20 with the bottom surface of the legs 64 spaced about several millimeters or one-tenth of a millimeter from the inner surface of the package 20. Heat generated in the IC pellet is drawn off to the outside through the mounting part 60, reinforcing walls 62, heat-radiating legs 64 and further through the thin walls of the package 20. With the semiconductor device of this invention wherein the bottom surface of the heat-radiating legs 64 is exposed out of the package 20, about a twice larger amount of heat can be radiated than in the conventional semiconductor device. Where the heat-radiating legs 64 are embedded in the package 20 with the bottom surface of said legs 64 set very close to the inner surface of the package 20, then a one and half times larger amount of heat can be expelled to the outside than in the prior art semiconductor device. The mounting frame assembly 68 comprising the mounting units 58 of FIG. 10 can be fabricated from a metal plate 66 of FIG. 12 by punching or etching the metal plate 66 in the form of solid lines shown in FIG. 12, and bending the cutout pieces along the broken lines. Referring to FIG. 12, plate segments denoted by referential numeral 70 correspond to the reinforcing side walls 62 of FIG. 10. Plate segments indicated by referential numeral 72 correspond to the heat-radiating legs 64 of FIG. 10.

As mentioned above, this invention provides a packaged semiconductor device which comprises a mounting unit so constructed as to ensure mechanical stability and high bent radiation and consequently retains good electric property.

The packaged semiconductor device of the invention proves prominently effective, when used as an IC device including SSI, MSI and LSI devices. Obviously, the invention is applicable not only to the IC device, but also to a discrete semiconductor device with sufficiently high efficiency.

What we claim is:
1. A packaged semiconductor device comprising:
a semiconductor pellet;
a mounting unit including:
(i) a planar mounting part having said semiconductor pellet adhesively mounted thereon;
(ii) a pair of supporting bars extending from said mounting part in opposite directions;
(iii) first side plate sections for reinforcing said planar mounting part, said first side plate sections formed by bending first edge portions of said mounting part at a first oblique angle with respect to the plane of said mounting part;
(iv) second side plate sections for reinforcing said planar mounting part, said second side plate sections formed by bending second edge portions of said mounting part at a second oblique angle with respect to the plane of said mounting part;
a package member comprising an electrically insulative resin which contracts when cured to completely encapsulate said mounting unit and said semiconductor pellet in said resin substantially at the center of said package member, said resin being in direct contact with said pellet and said mounting unit, said side plate sections preventing stresses from damaging said pellet when said resin contracts; and
a plurality of individually separate lead members, each of said lead members being fixed to the package member and electrically connected at one end to said semiconductor pellet and extending at its other end outside of the package member.

2. The packaged semiconductor device of claim 1, wherein said first angle and said second angle are equal but opposite with respect to the plane of said mounting part.

3. The packaged semiconductor device of claim 2, wherein said first angle and said second angle are perpendicular with respect to the plane of said mounting part.

4. The packaged semiconductor device according to claim 1, wherein said mounting unit embedded in said package member further includes at least one heat-radiating leg extending from said first side plate sections.

5. The packaged semiconductor device according to claim 4, wherein the bottom surface of said heat-radiating leg is positioned very close to a surface of said package member.

6. The packaged semiconductor device according to claim 5, wherein said heat-radiating leg extends outside of said package member.

7. The packaged semiconductor device according to claim 4, wherein said heat-radiating leg is parallel with the plane of said mounting part.

8. A packaged semiconductor device comprising:
a semiconductor pellet;
a mounting unit including;
  (i) A planar mounting part having said semiconductor pellet adhesively mounted thereon;
  (ii) A pair of supporting bars extending from said mounting part in opposite directions; and
  (iii) A raised flange extending continuously about the periphery of said mounting part for reinforcing said mounting part, said flange being formed by bending the edge of said mounting part upwardly with respect to the top surface of said mounting part;
a package member comprising an electrically insulative resin which contracts when cured to completely encapsulate said semiconductor pellet and said mounting unit in said resin substantially at the center of said package member, said resin being in direct contact with said pellet and said mounting unit, said continuous flange preventing stresses from damaging said pellet when said resin contracts; and
a plurality of individually separate lead members fixed to said package member, each of said lead members being electrically connected at one end to said semiconductor pellet and extending at its other end outside of said package member.

9. A packaged semiconductor device comprising:
a semiconductor pellet;
a mounting unit including;
  (i) A planar mounting part on which said semiconductor pellet is adhesively mounted;
  (ii) A pair of supporting bars extending from said mounting part in opposite directions; and
  (iii) A pair of side plate sections for reinforcing said mounting part, said side plate sections being formed by bending the edge portions of said mounting part so as to extend angularly from the plane of said mounting part;
a package member made of an electrically insulative resin which contracts when cured to encapsulate said mounting unit and said semiconductor pellet substantially at the center of said package member, said resin being in direct contact with said pellet and said mounting unit; and
a plurality of individually separate lead members fixed to the package member, each said lead member having one end close to the mounting part and electrically connected to said semiconductor pellet, and another end extending outside the package member.

10. The packaged semiconductor device according to claim 9, wherein said pair of side plate sections are formed by bending edge portions of said mounting part substantially at right angles to said mounting part.

11. The packaged semiconductor device according to claim 10, wherein the mounting unit embedded in said package member further includes a heat-radiating leg extending from an edge of a side plate section.

12. The packaged semiconductor device according to claim 11, wherein the bottom surface of said heat-radiating leg is positioned very close to a surface of said package member.

13. The packaged semiconductor device according to claim 11, wherein said heat-radiating leg extends outside of said package member.

14. The packaged semiconductor device according to claim 11, wherein said heat-radiating leg extends parallel with said mounting part.

* * * * *